(12) United States Patent
Choi

(10) Patent No.: US 8,605,517 B2
(45) Date of Patent: Dec. 10, 2013

(54) VARIABLE RESISTANCE MEMORY DEVICES USING READ MIRROR CURRENTS

(75) Inventor: Young-Don Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 82 days.

(21) Appl. No.: 13/346,377

(22) Filed: Jan. 9, 2012

(65) Prior Publication Data

US 2012/0176830 A1 Jul. 12, 2012

(30) Foreign Application Priority Data

Jan. 10, 2011 (KR) .......................... 10-2011-0002343

(51) Int. Cl.
*G11C 7/22* (2006.01)

(52) U.S. Cl.
CPC ........................................ *G11C 7/22* (2013.01)
USPC ..................... 365/189.011; 365/196; 365/207; 365/189.07; 365/185.2; 365/189.09

(58) Field of Classification Search
CPC .............. G11C 16/28; G11C 11/5642; G11C 2207/063; G11C 16/26
USPC ............. 365/185.2, 189.011, 189.07, 189.09, 365/185.21, 207, 196
See application file for complete search history.

(56) References Cited

U.S. PATENT DOCUMENTS 7,778,065 B2 8/2010 Lamorey et al.
2011/0103140 A1* 5/2011 Chung .......................... 365/163

FOREIGN PATENT DOCUMENTS

JP 2009-266304 A 11/2009
KR 10-2009-0010600 A 1/2009

* cited by examiner

*Primary Examiner* — Thong Q Le
(74) *Attorney, Agent, or Firm* — Myers Bigel Sibley & Sajovec, P.A.

(57) ABSTRACT

A nonvolatile memory device includes a variable resistance memory element and a read circuit coupled to the variable resistance memory element at a first signal node and configured to provide a read current to the variable resistance memory element via the first signal node, to a provide a mirror current at a second signal node responsive to the cell current and to generate an output signal indicative of a state of the variable resistance memory element responsive to a voltage at the second signal node.

20 Claims, 16 Drawing Sheets

VARIABLE RESISTANCE MEMORY DEVICES USING READ MIRROR CURRENTS

CROSS-REFERENCE TO RELATED APPLICATION

This application claims priority from Korean Patent Application No. 10-2011-0002343 filed on Jan. 10, 2011 in the Korean Intellectual Property Office, the disclosure of which is incorporated herein by reference in its entirety.

BACKGROUND

The inventive subject matter relates to nonvolatile memory devices and, more particularly, to variable resistance nonvolatile memory devices.

Examples of nonvolatile memories using variable resistance materials include phase-change random access memories (PRAMs), resistive RAMs (RRAMs), and magnetic RAMs (MRAMs). While dynamic RAMs (DRAMs) or flash memories store data using charges, nonvolatile memories using resistance materials store data using a state change of a phase-change material such as chalcogenide alloy (as in the case of PRAMs), a resistance change of a variable resistance material (as in the case of RRAMs), or a resistance change of a magnetic tunnel junction (MTJ) thin film according to a magnetization state of a ferromagnetic material (as in the case of MRAMs).

For example, a phase-change material of a PRAM cell takes on a crystalline state or an amorphous state as it is cooled after being heated. Typically, the phase-change material has low resistance in the crystalline state and has high resistance in the amorphous state. Therefore, the crystalline state may be defined as "set" data or data "0", and the amorphous state may be defined as "reset" data or data "1".

A read circuit which reads data stored in a phase-change memory cell may include a clamping element. The clamping element maintains a phase of the phase-change memory cell during a read operation. In particular, the clamping element maintains a read current substantially constant while preventing the phase-change memory cell from having a voltage higher than a predetermined voltage. A conventional clamping element may use an n-channel metal oxide semiconductor (NMOS) transistor and may clamp the voltage of the phase-change memory cell to a voltage level equal to a difference (i.e., Vcmp−Vth) between a gate voltage Vcmp and threshold voltage Vth of the NMOS transistor. However, since the threshold voltage Vth varies according to process and temperature, the clamping operation may not be stable.

A typical read circuit reads data by providing the read current to the phase-change memory cell. To generate the read current, however, a high-level step-up voltage Vpp, generated by pumping a power supply voltage, is typically used. The pumping circuit that generates the step-up voltage Vpp may have a low current efficiency and may occupy a large area.

SUMMARY

In some embodiments of the inventive subject matter, a read circuit includes a comparison circuit configured to compare a voltage at a first signal node with a reference voltage and to responsively generate a control signal. The read circuit also includes a read current control circuit connected between a first voltage node and the first signal node and configured to provide a read current to a memory element responsive to the control signal. The read circuit further includes a mirror circuit connected between a second voltage node and a second signal node and configured to provide a mirror current in response to the control signal and a sense circuit configured to sense a voltage at the second signal node and to responsively generate an output signal indicative of a state of the memory element.

In some embodiments, the read current control circuit may include a first p-channel metal oxide semiconductor (PMOS) transistor which is connected between the first voltage node and the first signal node and receives the control signal at a gate thereof. In further embodiments, the mirror circuit may include a second PMOS transistor which is connected between the second voltage node and the second signal node and receives the control signal at a gate thereof. The first voltage node may be a power supply node and the second voltage node may be a power supply node.

In some embodiments, the read circuit may include a reference current control circuit connected to the second signal node and configured to generate a reference current that flows from the second signal node to a ground node. The reference voltage may include a first reference voltage and the reference current control circuit may include an n-channel metal oxide semiconductor (NMOS) transistor connected between the second signal node and the ground node and configured to receive a second reference voltage at a gate thereof. The second reference voltage may be a constant voltage.

In further embodiments, the read circuit may include a first discharge circuit connected to the first signal node and configured to discharge the first signal node and a second discharge circuit connected to an output node of the comparison circuit and configured to discharge an output of the comparison circuit. The read circuit may further include a first auxiliary current control circuit connected to the second signal node and configured to provide a first auxiliary current to the second signal node and a second auxiliary current control circuit connected to the second signal node and configured to provide a second auxiliary current that flows from the second signal node to the ground node.

Additional embodiments of the inventive subject matter provide a nonvolatile memory device including a variable resistive element connected to a first signal node, a comparison circuit configured to compare a voltage at the first signal node with a reference voltage and to responsively produce a control signal, a first PMOS transistor connected between a power supply node and the first signal node and configured to provide a read current in response to the control signal, a second PMOS transistor connected between the power supply node and a second signal node and configured to provide a mirror current responsive to the control signal and a sense circuit configured to sense a voltage at the second signal node and to responsively generate an output signal indicative of a state of the variable resistance memory element.

Further embodiments of the inventive subject matter provide a nonvolatile memory device including a variable resistance memory element and a read circuit coupled to the variable resistance memory element at a first signal node. The read circuit is configured to provide a read current to the variable resistance memory element via the first signal node, to a provide a mirror current at a second signal node responsive to the cell current and to generate an output signal indicative of a state of the variable resistance memory element responsive to a voltage at the second signal node.

BRIEF DESCRIPTION OF THE DRAWINGS

The above and other aspects and features of the inventive subject matter will become more apparent by describing in detail exemplary embodiments thereof with reference to the attached drawings, in which.

DETAILED DESCRIPTION

The inventive subject matter will now be described more fully hereinafter with reference to the accompanying drawings, in which preferred embodiments of the inventive subject matter are shown. This inventive subject matter may, however, be embodied in different forms and should not be construed as limited to the embodiments set forth herein. Rather, these embodiments are provided so that this disclosure will be thorough and complete, and will fully convey the scope of the inventive subject matter to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive subject matter (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive subject matter belongs. It is noted that the use of any and all examples, or exemplary terms provided herein is intended merely to better illuminate the inventive subject matter and is not a limitation on the scope of the inventive subject matter unless otherwise specified. Further, unless defined otherwise, all terms defined in generally used dictionaries may not be overly interpreted.

Figure 1:
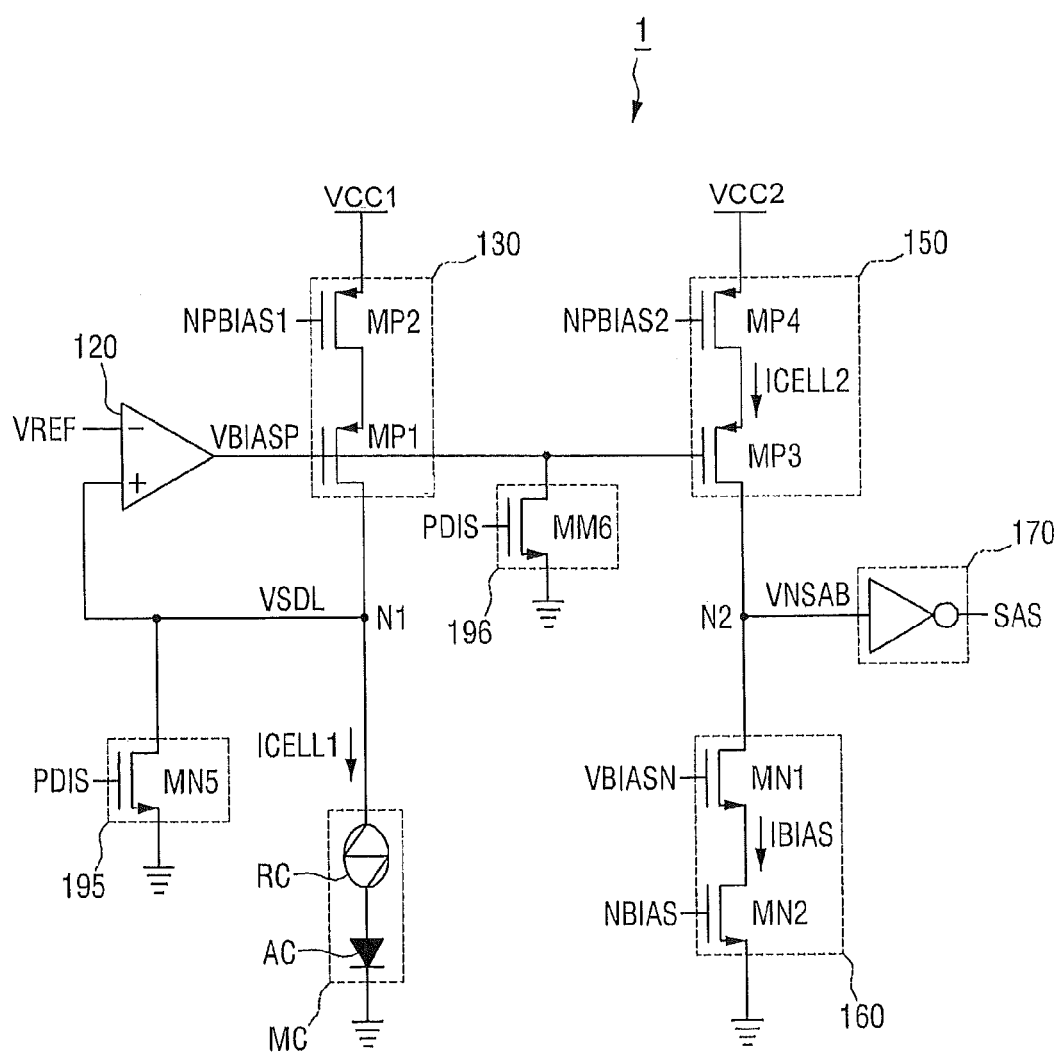
FIG. 1 is a circuit diagram of a nonvolatile memory device according to a first exemplary embodiment of the inventive subject matter.
Figure 2:
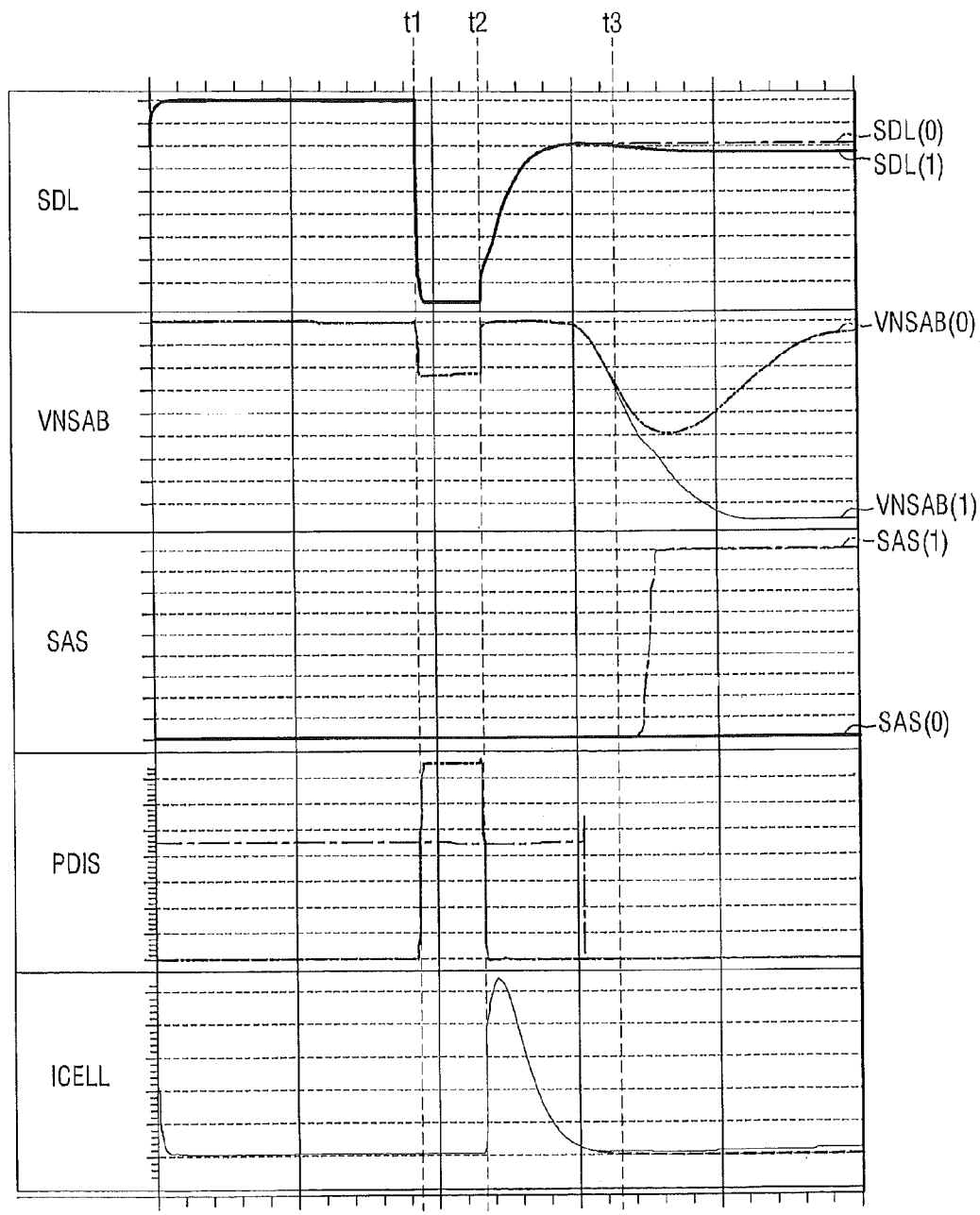
FIG. 2 is a timing diagram for explaining the operation of the nonvolatile memory device according to the first exemplary embodiment of the inventive subject matter.
Figure 3:
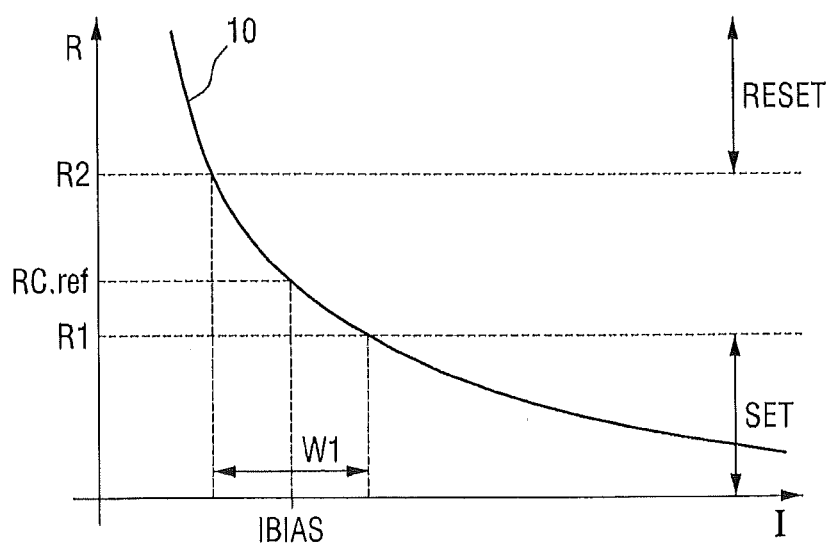
FIG. 3 shows an I-R curve for explaining the operation of the nonvolatile memory device according to the first exemplary embodiment of the inventive subject matter.

FIG. 1 is a circuit diagram of a nonvolatile memory device 1 according to a first exemplary embodiment of the inventive subject matter. FIGS. 2 and 3 respectively show a timing diagram and an I-R curve for explaining the operation of the nonvolatile memory device 1 according to the first exemplary embodiment of the inventive subject matter.

Referring to FIG. 1, the nonvolatile memory device 1 according to the first exemplary embodiment includes a comparison circuit 120, a read current control circuit 130, a mirror circuit 150, a reference current control circuit 160, a sense circuit 170, a first discharge circuit 195, and a second discharge circuit 196.

The comparison circuit 120 is connected to a first signal node N1. The comparison circuit 120 compares a voltage VSDL of the first signal node N1 with a first reference voltage VREF and outputs a control signal VBIASP based on the comparison result. As shown in the drawing, the comparison circuit 120 may be, but is not limited to, an operational amplifier.

The read current control circuit 130 is connected between a first voltage node VCC1 and the first signal node N1 and provides a read current ICELL1 in response to the control signal VBIASP. The first voltage node VCC1 may be, for example, a power supply node.

The read current control circuit 130 may include a first p-channel metal oxide semiconductor (PMOS) transistor MP1 which is connected between the first voltage node VCC1 and the first signal node N1 and receives the control signal VBIASP at a gate thereof. The read current control circuit 130 may further include a second PMOS transistor MP2 which is connected in series with the first PMOS transistor MP1 between the first voltage node VCC1 and the first signal node N1 and receives a first select signal NPBIAS1 at a gate thereof.

The mirror circuit 150 is connected between a second voltage node VCC2 and a second signal node N2 and provides a mirroring current ICELL2, which mirrors the read current ICELL1, in response to the control signal VBIASP. The second voltage node VCC2 may be, for example, a power supply node.

The mirror circuit 150 includes a third PMOS transistor MP3 which is connected between the second voltage node VCC2 and the second signal node N2 and receives the control signal VBIASP at a gate thereof. The mirror circuit 150 may further include a fourth PMOS transistor MP4 which is connected in series with the third PMOS transistor MP3 between the second voltage node VCC2 and the second signal node N2 and receives a second select signal NPBIAS2 at a gate thereof. Here, the second select signal NPBIAS2 may be, but is not limited to, a signal having the same waveform as the first select signal NPBIAS1.

The reference current control circuit 160 is connected to the second signal node N2 and generates a reference current IBIAS that flows from the second signal node N2 to a ground node.

Specifically, the reference current control circuit 160 includes a first n-channel metal oxide semiconductor (NMOS) transistor MN1 which is connected between the second signal node N2 and the ground node and receives a second reference voltage VBIASN at a gate thereof. The reference current control circuit 160 may further include a second NMOS transistor MN2 which is connected in series with the first NMOS transistor MN1 between the second signal node N2 and the ground node and receives a third select signal NBIAS at a gate thereof. Here, the second reference voltage VBIASN may be, but is not limited to, a constant voltage.

The sense circuit 170 senses a voltage VNSAB of the second signal node N2 and provides an output signal SAS based on the sensing result. The sense circuit 170 may include, but is not limited to, an inverter which inverts the voltage VNSAB of the second signal node N2. The inverter may swing between the ground voltage and the power supply voltage and operate at high speed.

The first discharge circuit 195 is connected to the first signal node N1 and discharges the first signal node N1 before providing the read current ICELL1 to a nonvolatile memory cell MC. The first discharge circuit 195 may include an NMOS transistor MN5 which is connected between the first signal node N1 and the ground node and receives a discharge signal PDIS at a gate thereof.

The second discharge circuit 196 is connected to an output node of the comparison circuit 120 and discharges the output node before providing the read current ICELL1 to the nonvolatile memory cell MC. The second discharge circuit 196 may include an NMOS transistor MN6 which is connected between the output node of the comparator 120 and the ground node and receives the discharge signal PDIS at a gate thereof.

The nonvolatile memory cell MC may include a variable resistive element RC and an access element AC. The variable resistive element RC is connected to the first signal node N1 and includes a phase-change material having a different resistance value according to data stored therein. The access element AC controls a current that flows through the variable resistive element RC. Here, the access element AC may be a diode or a transistor coupled in series with the variable resistive element RC. The variable resistive element RC shown in the drawing is a diode. Various types of materials may be used as the phase-change material in the variable resistive element RC. For example, the phase-change material may be a combination of two elements, such as GaSb, InSb, InSe, $Sb_2Te_3$ or GeTe, a combination of three elements, such as GeSbTe, GaSeTe, InSbTe, $SnSb_2Te_4$ or InSbGe, or a combination of four elements such as AgInSbTe, (GeSn)SbTe, GeSb(SeTe) or $Te_{81}Ge_{15}Sb_2S_2$. In particular, GeSbTe, which is a combination of germanium (Ge), antimony (Sb) and tellurium (Te), may be used as the phase-change material.

Referring to FIGS. 1 and 2, the nonvolatile memory device 1 according to the first exemplary embodiment of the inventive subject matter operates as follows. At a time t1, the first discharge circuit 195 and the second discharge circuit 196 respectively discharge the first signal node N1 and the output node of the comparison circuit 120 to a level of the ground voltage. At a time t2, the read current ICELL1 is provided to the nonvolatile memory cell MC. Specifically, the first select signal NPBIAS1 and the second select signal NPBIAS2 are drive to a low level, and the third select signal NBIAS is driven to a high level. Accordingly, the second PMOS transistor MP2, the fourth PMOS transistor MP4, and the second NMOS transistor MN2 are turned on.

The comparison circuit 120 compares the voltage VSDL of the first signal node N1 with the first reference voltage VREF and outputs the control signal VBIASP based on the comparison. The first PMOS transistor MP1 operates in response to the control signal VBIASP and thus adjusts the voltage VSDL of the first signal node N1. Through the feedback process of the comparison circuit 120 and the first PMOS transistor MP1, the voltage VSDL of the first signal node N1 approaches the first reference voltage VREF, i.e., the voltage VSDL of the first signal node N1 is clamped to a voltage level equal to the first reference voltage VREF. The voltage VSDL of the first signal node N1 is thus clamped to a voltage that does not change the state of the variable resistive element RC.

At a time t3, a level of the read current ICELL1 depends on the resistance of the variable resistive element RC. The higher the resistance value of the variable resistive element RC, the smaller the read current ICELL1. Conversely, the lower the resistance value of the variable resistive element RC, the greater the read current ICELL1.

The mirror circuit 150 generates the mirroring current ICELL2 which mirrors the read current ICELL1. In FIG. 1, the magnitude of the read current ICELL1 may be substantially equal to that of the mirroring current ICELL2.

The voltage VNSAB of the second signal node N2 is determined by a difference between the mirroring current ICELL2 and the reference current IBIAS. When the mirroring current ICELL2 is greater than the reference current IBIAS, the voltage VNSAB of the second signal node N2 increases. When the mirroring current ICELL2 is smaller than the reference current IBIAS, the voltage VNSAB of the second signal node N2 decreases. The sense circuit 170 inverts the voltage VNSAB of the second signal node N2 and provides the output signal SAS.

In summary, when reset data is stored in the variable resistive element RC, the read current ICELL1 is small, and the mirroring current ICELL2 is also small. As a result, the voltage VNSAB of the second signal node N2 is low, causing the output signal SAS to have a high level ("1"). When set data is stored in the variable resistive element RC, the read current ICELL1 is large, and the mirroring current ICELL2 is also large. As a result, the voltage VNSAB of the second signal node N2 is high, causing the output signal SAS to become a low level ("0").

Referring to FIG. 3, the x-axis represents current, and the y-axis represents resistance. Resistance equal to or lower than R1 may be perceived as a "set" state, and resistance equal to or higher than R2 may be perceived as "reset" state. Reference resistance RC.ref, which is used to distinguish between the "set" state and the "reset" state, lies between R1 and R2. Therefore, the reference current IBIAS corresponding to the reference resistance RC.ref lies within a window W1.

In the nonvolatile memory device 1 according to the first exemplary embodiment of the inventive subject matter, the reference resistance RC.ref may be determined by Equation 1, where VAC is a voltage at both terminals of the access element AC. Resistance in a case where the mirroring current ICELL2 is equal to the reference current IBIAS may be calculated as the reference resistance RC.ref using Equation 1. When the mirroring current ICELL2 is greater than the reference current IBIAS, the resistance of the variable resistive element RC is smaller than the reference resistance RC.ref. Therefore, the resistance of the variable resistive element RC is the "set" state resistance. When the mirroring current ICELL2 is smaller than the reference current IBIAS, the resistance of the variable resistive element RC is higher than the reference resistance RC.ref. Therefore, the resistance of the variable resistive element RC is the "reset" state resistance.

$$RC.ref = \frac{VREF - VAC}{IBIAS}. \quad (1)$$

The nonvolatile memory device 1 according to the first exemplary embodiment clamps the voltage VSDL of the first signal node N1 using the first PMOS transistor MP1 and the comparison circuit 120 (e.g., an operational amplifier). This clamping method may be less affected by a process or a temperature change, e.g., if an offset of the operational amplifier is designed carefully, the clamping operation can be performed in a stable manner.

The first voltage node VCC1 and/or the second voltage node VCC2 may be a power supply node, not a node having a step-up voltage Vpp. Therefore, a pumping circuit which generates the step-up voltage is unnecessary. The absence of the pumping circuit eliminates power consumption of the pumping circuit and negates the need for a chip area for the pumping circuit.

Figure 4:
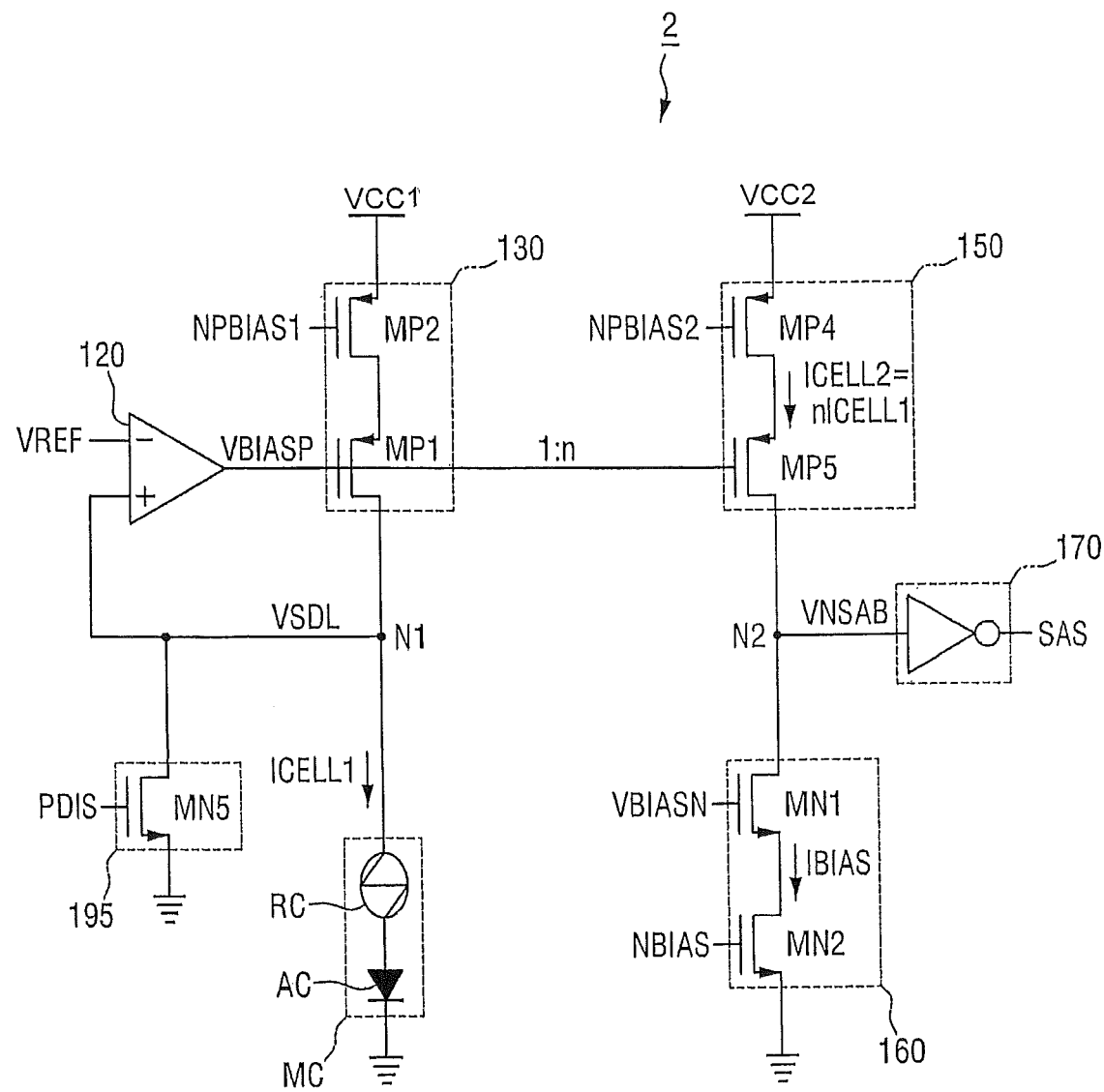
FIG. 4 is a circuit diagram of a nonvolatile memory device according to a second exemplary embodiment of the inventive subject matter.

FIG. 4 is a circuit diagram of a nonvolatile memory device 2 according to a second exemplary embodiment of the inventive subject matter.

Referring to FIG. 4, the nonvolatile memory device 2 according to the second exemplary embodiment is different from the nonvolatile memory device 1 according to the first exemplary embodiment in that a ratio of a read current ICELL1 to a mirroring current ICELL2 is 1:n (ICELL2=nICELL1, where n is a positive number). A mirror circuit 150 may include a fifth PMOS transistor MP5 which has a different size from a first PMOS transistor MP1. For example, a ratio of a width of the first PMOS transistor MP1 to a width of the fifth PMOS transistor MP5 may be 1:n.

Figure 5:
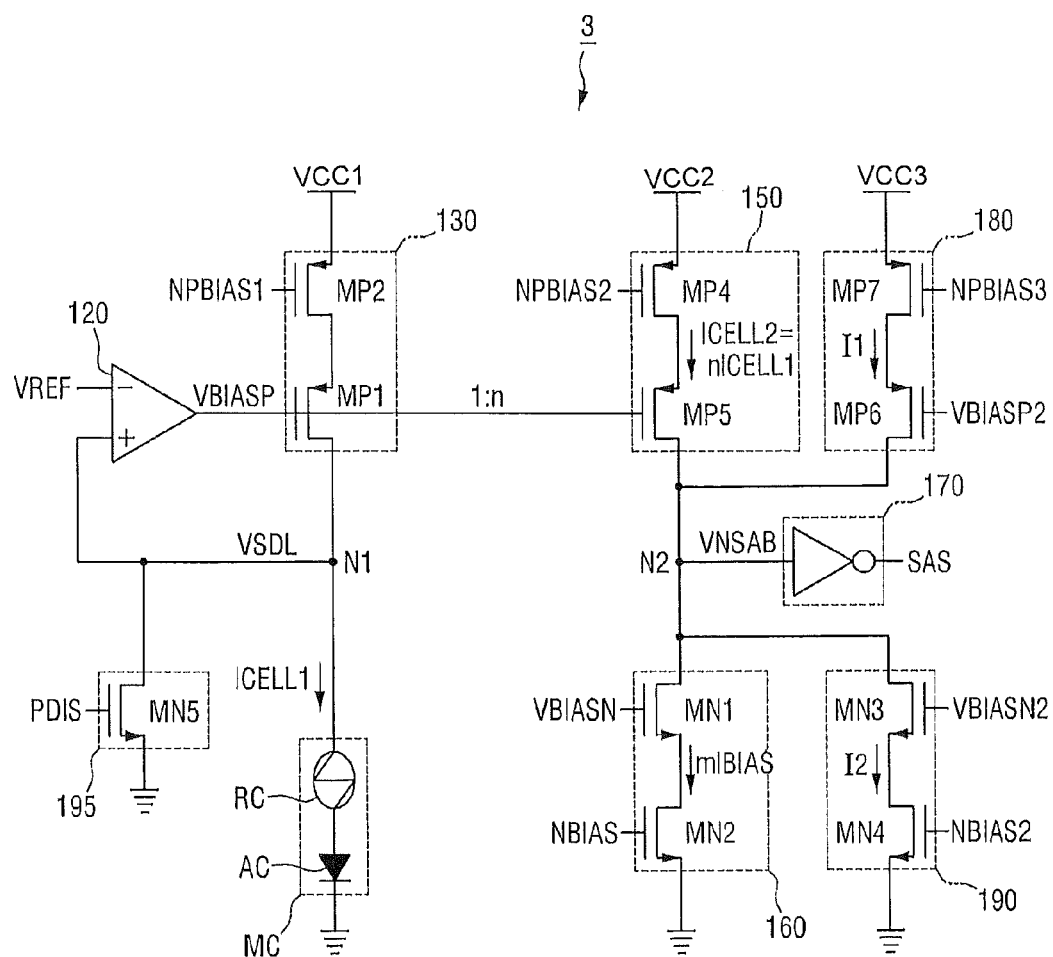
FIG. 5 is a circuit diagram of a nonvolatile memory device according to a third exemplary embodiment of the inventive subject matter.
Figure 6:
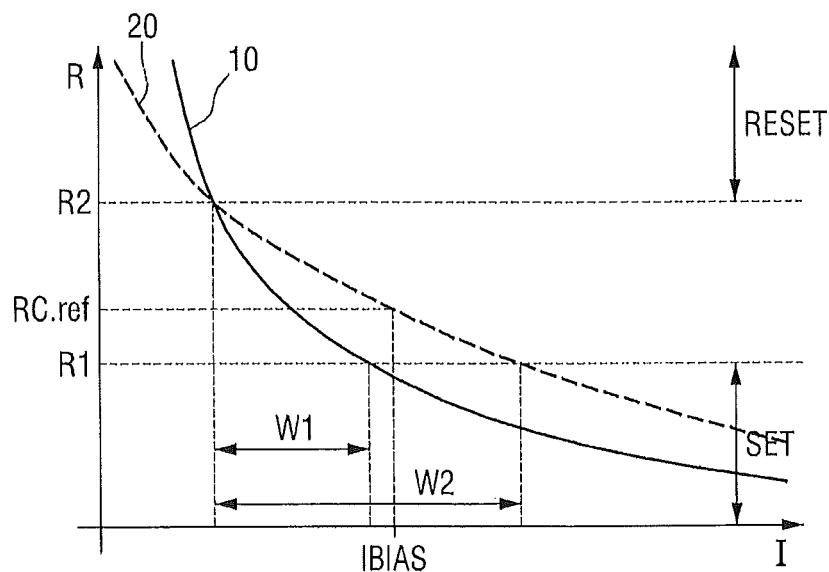
FIG. 6 shows an I-R curve for explaining the operation of the nonvolatile memory device according to the third exemplary embodiment of the inventive subject matter.

FIG. 5 is a circuit diagram of a nonvolatile memory device 3 according to a third exemplary embodiment of the inventive subject matter. FIG. 6 shows an I-R curve for explaining the operation of the nonvolatile memory device 3 according to the third exemplary embodiment of the inventive subject matter.

Referring to FIG. 5, the nonvolatile memory device 3 according to the third exemplary embodiment is different from the nonvolatile memory device 2 according to the second exemplary embodiment in that it further includes a first auxiliary current control circuit 180 and a second auxiliary current control circuit 190.

The first auxiliary current control circuit 180 is connected to a second signal node N2 and provides a first auxiliary current I1 to the second signal node N2.

The first auxiliary current control circuit 180 may include a sixth PMOS transistor MP6 which is connected between a third voltage node VCC3 and the second signal node N2 and receives a first auxiliary voltage VBIASP2 at a gate thereof. The first auxiliary current control circuit 180 may further include a seventh PMOS transistor MP7 which is connected in series with the sixth PMOS transistor MP6 between the third voltage node VCC3 and the second signal node N2 and receives a fourth select signal NPBIAS3 at a gate thereof. Here, the first auxiliary voltage VBIASP2 may be, but is not limited to, a constant voltage. In addition, the third voltage node VCC3 may be, but is not limited to, a power supply node.

The second auxiliary current control circuit 190 is connected to the second signal node N2 and provides a second auxiliary current I2 that flows from the second signal node N2 to a ground node.

The second auxiliary current control circuit 190 includes a third NMOS transistor MN3 which is connected between the second signal node N2 and the ground node and receives a second auxiliary voltage VBIASN2 at a gate thereof. The second auxiliary current control circuit 190 may further include a fourth NMOS transistor MN4 which is connected in series with the third NMOS transistor MN3 between the second signal node N2 and the ground node and receives a fourth select signal NBIAS2 at a gate thereof. Here, the second auxiliary voltage VBIASN2 may be, but is not limited to, a constant voltage.

The first auxiliary current control circuit 180 and the second auxiliary current control circuit 190 control a window for design for test (DFT)/design for manufacturing (DFM). That is, they may adjust a sensing boundary (i.e., the width and position of the window) for reading data.

Referring to FIG. 6, a curve 10 is an I-R curve of the nonvolatile memory device 1 according to the first exemplary embodiment, and a curve 20 is an I-R curve of the nonvolatile memory device 3 according to the third exemplary embodiment.

In the nonvolatile memory device 3 according to the third exemplary embodiment, reference resistance RC.ref may be determined by Equation 2. Resistance in a case where the sum of a mirroring current ICELL2 and the first auxiliary current I1 is equal to the sum of a reference current mIBIAS and the second auxiliary current I2 may be calculated as the reference resistance RC.ref using Equation 2. When the sum of the mirroring current ICELL2 and the first auxiliary current I1 is greater than the sum of the reference current mIBIAS and the second auxiliary current I2, the resistance of a variable resistive element RC is lower than the reference resistance RC.ref. Therefore, the resistance of the variable resistive element RC is a "set" state resistance. On the other hand, when the sum of the mirroring current ICELL2 and the first auxiliary current I1 is smaller than the sum of the reference current mIBIAS and the second auxiliary current I2, the resistance of the variable resistive element RC is higher than the reference resistance RC.ref. Therefore, the resistance of the variable resistive element RC is a "reset" state resistance.

$$RC.ref = \frac{n(VREF - VAC)}{mIBIAS + I2 - I1}. \qquad (2)$$

The wider the window W1 or W2, the easier it is to position the reference current mIBIAS within the window W1 or W2. Therefore, the "reset" state resistance and the "set" state resistance can be clearly distinguished. As shown in the drawing, the window W2 is wider than the window W1. As apparent from Equation 2, the form of the curve 20 can be controlled by adjusting n, m, the first auxiliary current I1, and the second auxiliary current I2. Accordingly, the width and boundary of the window W2 can be controlled. This is because, assuming that R1 and R2 are constant, the width and boundary of the window W2 change as the form of the curve 20 changes. Specifically, a nonvolatile memory cell MC according to the third exemplary embodiment may control the magnitude of the first auxiliary current I1 and the magnitude of the second auxiliary current I2 by using the first auxiliary current control circuit 180 and the second auxiliary current control circuit 190. In addition, the nonvolatile memory cell MC may control n and m by adjusting the size of a fifth PMOS transistor MP5 and the size of a first NMOS transistor MN1.

Figure 7:
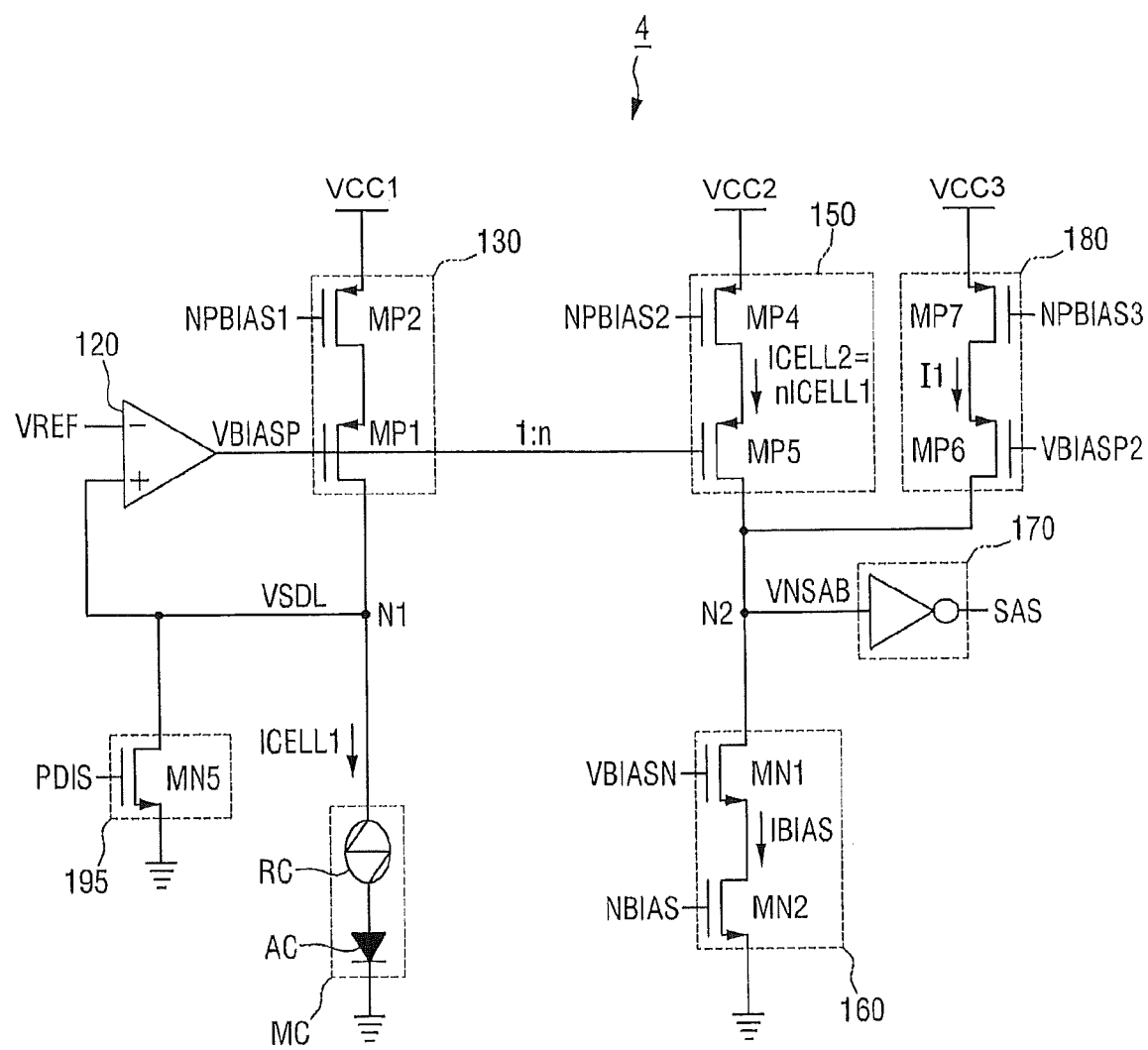
FIG. 7 is a circuit diagram of a nonvolatile memory device according to a fourth exemplary embodiment of the inventive subject matter.
Figure 8:
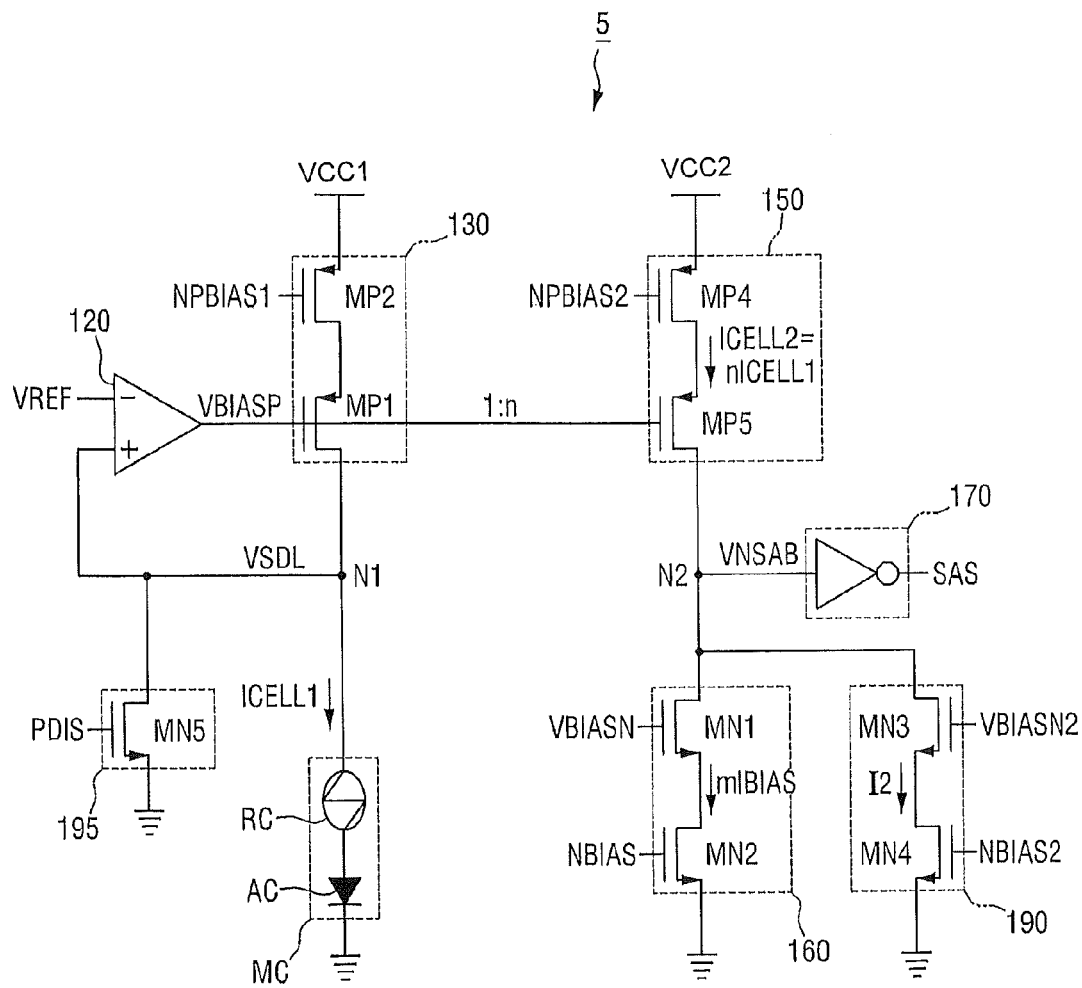
FIG. 8 is a circuit diagram of a nonvolatile memory device according to a fifth exemplary embodiment of the inventive subject matter.

FIG. 7 is a circuit diagram of a nonvolatile memory device 4 according to a fourth exemplary embodiment of the inventive subject matter. FIG. 8 is a circuit diagram of a nonvolatile memory device 5 according to a fifth exemplary embodiment of the inventive subject matter.

Referring to FIG. 7, the nonvolatile memory device 4 according to the fourth exemplary embodiment is different from the nonvolatile memory device 1 according to the first exemplary embodiment in that it further include a first auxiliary current control circuit 180. Referring to FIG. 8, the nonvolatile memory device 5 according to the fifth exemplary embodiment is different from the nonvolatile memory device 1 according to the first exemplary embodiment in that it further includes a second auxiliary current control circuit 190.

As described above, any one of the first auxiliary current control circuit 180 and the second auxiliary current control circuit 190 can control a window for DFT/DFM.

Figure 9:
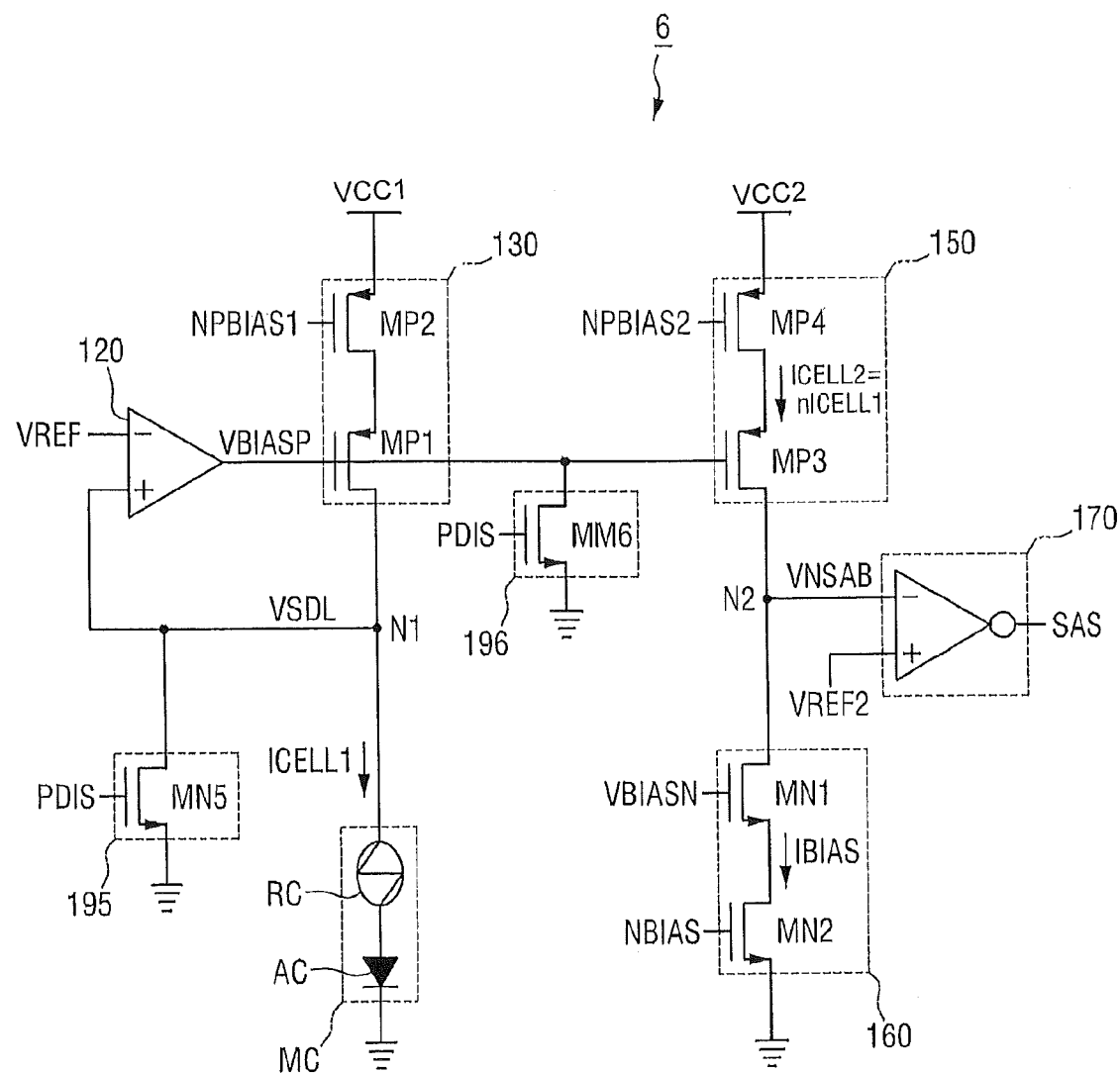
FIG. 9 is a circuit diagram of a nonvolatile memory device according to a sixth exemplary embodiment of the inventive subject matter.

FIG. 9 is a circuit diagram of a nonvolatile memory device 6 according to a sixth exemplary embodiment of the inventive subject matter.

Referring to FIG. 9, the nonvolatile memory device 6 according to the sixth exemplary embodiment is different from the nonvolatile memory device 1 according to the first exemplary embodiment in that a sense circuit 170 uses an operational amplifier instead of an inverter. The operational amplifier compares a third reference voltage VREF2 with a voltage VNSAB of a second signal node N2 and provides an output signal SAS based on the comparison result.

FIGS. 10 through 14 are diagrams illustrating memory systems including nonvolatile memory devices according to exemplary embodiments of the inventive subject matter.

Figure 10:
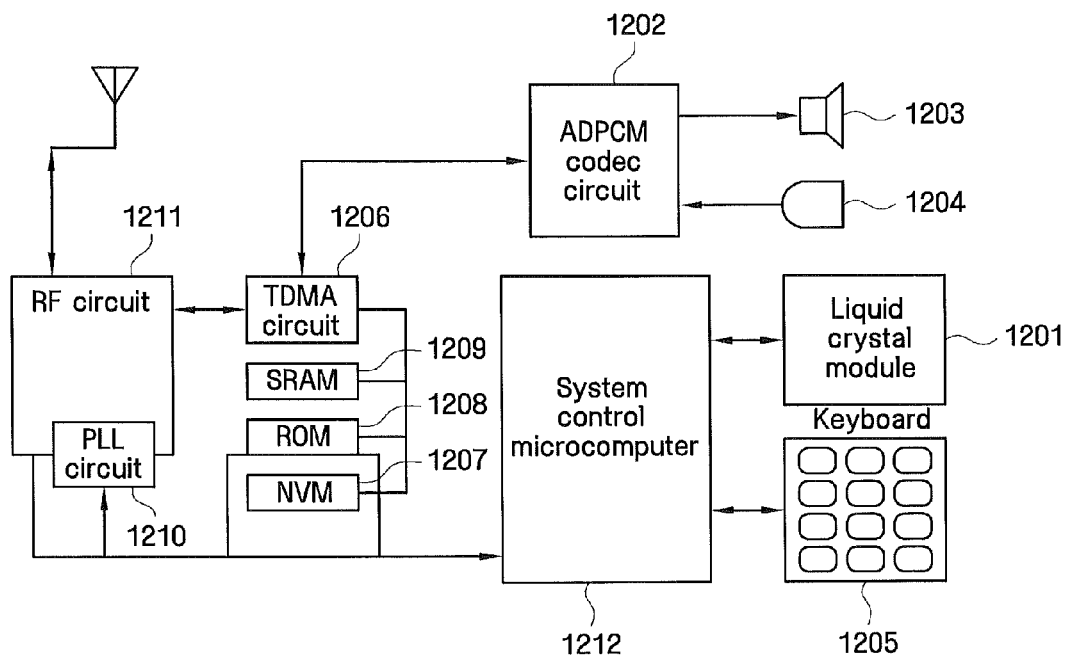
FIGS. 10 through 14 are diagrams illustrating memory systems according to first through fifth exemplary embodiments of the inventive subject matter.

FIG. 10 is a diagram illustrating a cellular phone system which uses nonvolatile memory devices according to exemplary embodiments of the inventive subject matter.

Referring to FIG. 10, the cellular phone system includes an adaptive differential pulse code modulation (ADPCM) codec circuit 1202 which compresses sound or decompresses compressed sound, a speaker 1203, a microphone 1204, a time division multiple access (TDMA) circuit 1206 which time-division multiplexes digital data, a phase-locked loop (PLL) circuit 1210 which sets a carrier frequency of a wireless signal, and a radio frequency (RF) circuit 1211 which transmits or receives a wireless signal.

In addition, the cellular phone system may include various types of memory devices. For example, the cellular phone system may include a nonvolatile memory device 1207, a read only memory (ROM) 1208, and a static random access memory (SRAM) 1209. The nonvolatile memory device 1207 may be any one of the nonvolatile memory devices according to the exemplary embodiments of the inventive subject matter and may store, for example, an identification (ID) number. The ROM 1208 may store programs, and the SRAM 1209 may serve as a work area for a system control microcomputer 1212 or temporarily store data. The system control microcomputer 1212 is a processor and may control the write operation and read operation of the nonvolatile memory device 1207.

Figure 11:
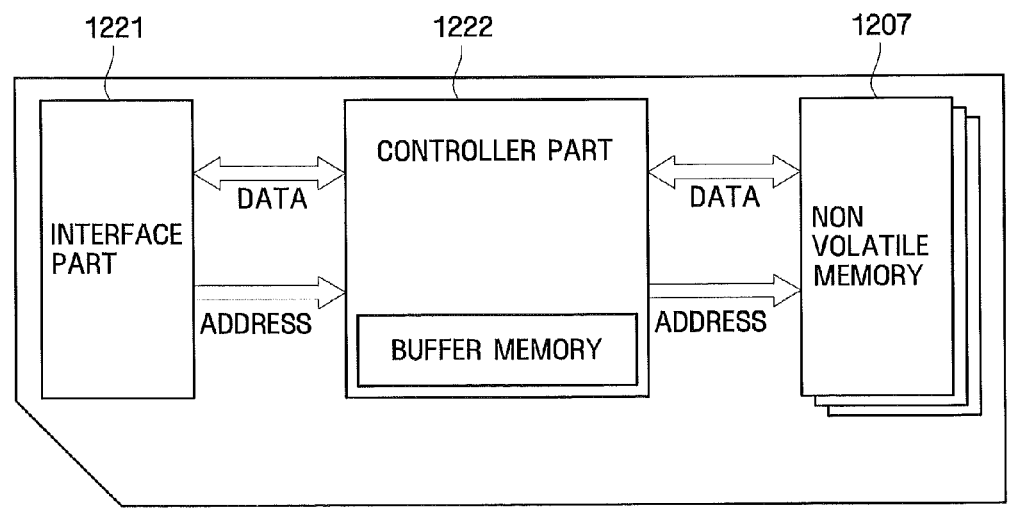

FIG. 11 is a diagram illustrating a memory card which uses nonvolatile memory devices according to exemplary embodiments of the inventive subject matter. The memory card may be, for example, a multimedia card (MMC), a secure digital (SD) card, a multi-use card, a micro SD card, a memory stick, a compact SD card, an ID card, a personal computer memory card international association (PCMCIA) card, a solid-state drive (SSD) card, a chip card, a smart card, or a universal serial bus (USB) card.

Referring to FIG. 11, the memory card may include an interface part 1221 which interfaces with an external device, a controller part 1222 which includes a buffer memory and controls the operation of the memory card, and one or more nonvolatile memory devices 1207 according to exemplary embodiments of the inventive subject matter. The controller part 1222 is a processor and may control the write and read operations of the nonvolatile memory devices 1207. Specifically, the controller part 1222 is coupled to each of the interface part 1221 and the nonvolatile memory devices 1207 by a data bus DATA and an address bus ADDRESS.

Figure 12:
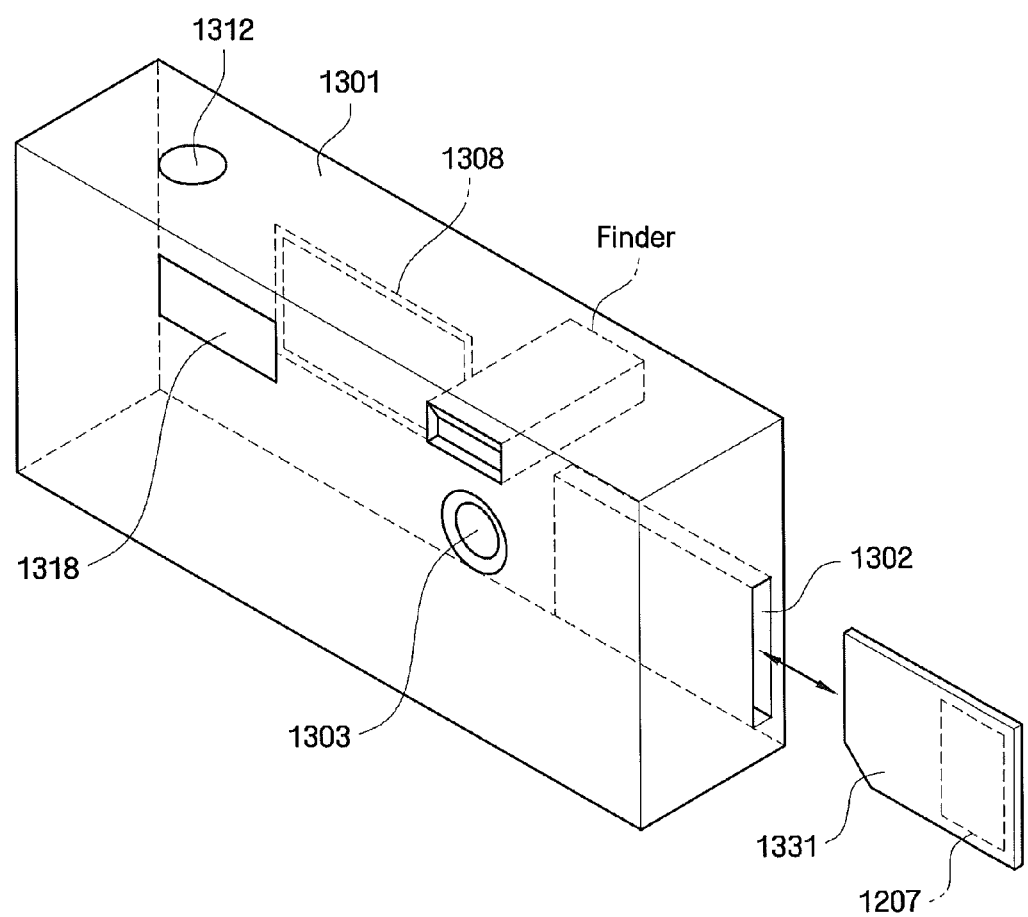

FIG. 12 is a diagram illustrating a digital still camera which uses nonvolatile memory devices according to exemplary embodiments of the inventive subject matter.

Referring to FIG. 12, the digital still camera includes a body 1301, a slot 1302, a lens 1303, a display 1308, a shutter button 1312, and a strobe 1318. In particular, a memory card 1331 may be inserted into the slot 1308 and include one or more nonvolatile memory devices 1207 according to exemplary embodiments of the inventive subject matter.

If the memory card 1331 is of a contact type, it electrically contacts a specified electrical circuit on a circuit board when it is inserted into the slot 1302. If the memory card 1331 is of a non-contact type, it communicates with the memory card 1331 using a wireless signal.

Figure 13:
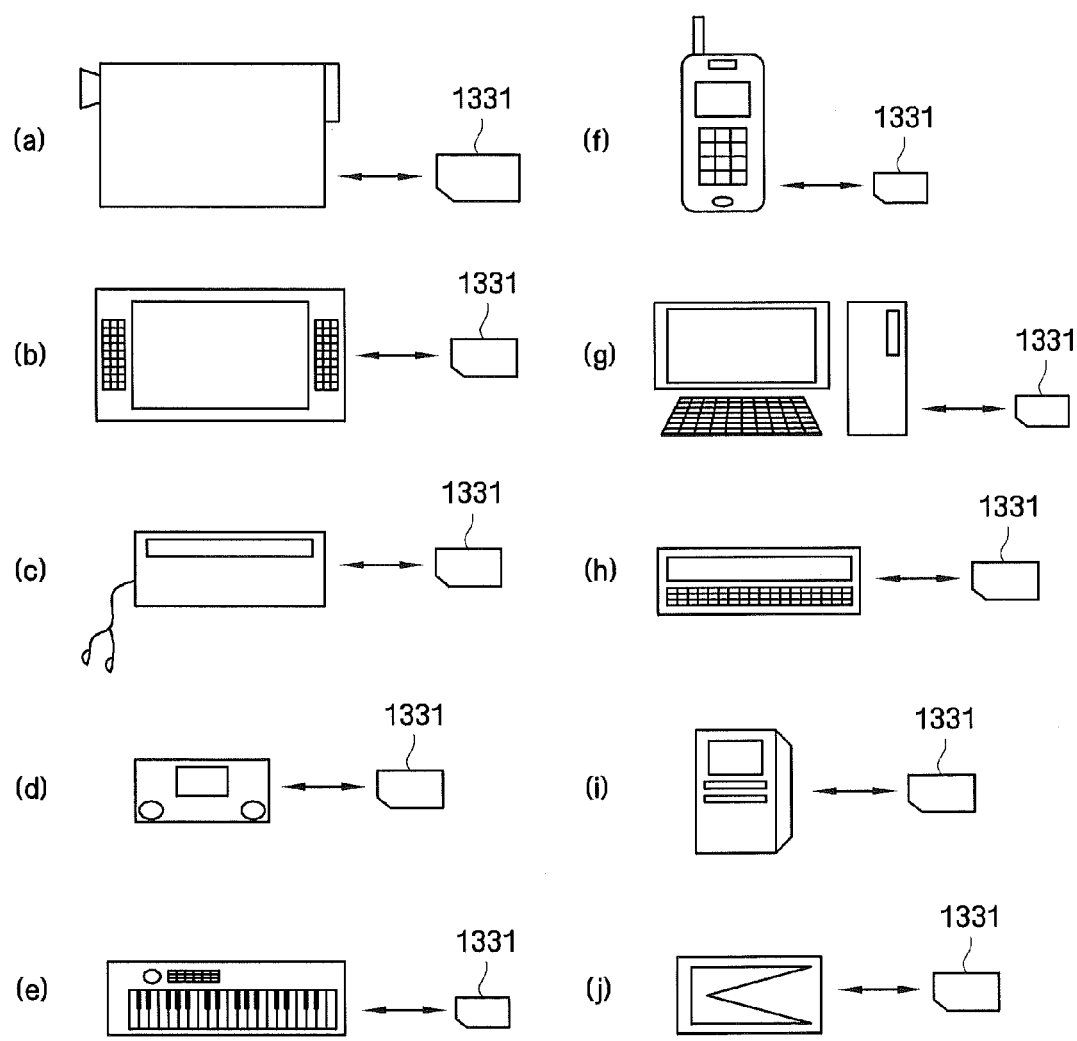

FIG. 13 is a diagram illustrating various systems which use the memory card 1331 of FIG. 12.

Referring to FIG. 13, the memory card 1331 may be used in (a) a video camera, (b) a television, (c) an audio device, (d) a game device, (e) an electronic music device, (f) a mobile phone, (g) a computer, (h) a personal digital assistant (PDA), (i) a voice recorder, and (j) a personal computer (PC) card.

Figure 14:
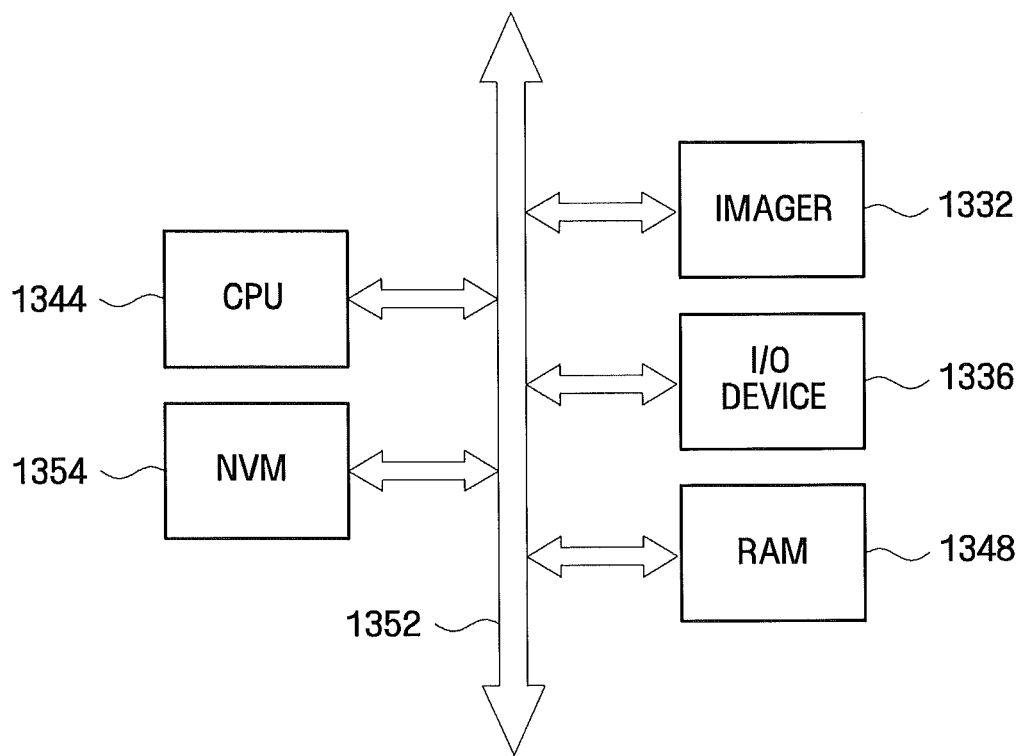

FIG. 14 is a diagram illustrating an image sensor system which uses nonvolatile memory devices according to exemplary embodiments of the inventive subject matter.

Referring to FIG. 14, the image sensor system may include an imager 1332, an input/output device 1336, a random access memory (RAM) 1348, a central processing circuit (CPU) 1344, and a nonvolatile memory device 1354 according to exemplary embodiments of the inventive subject matter. These components, i.e., the imager 1332, the input/output device 1336, the RAM 1348, the CPU 1344, and the nonvolatile memory device 1354 communicate with each other using a bus 1352. The imager 1332 may include a photo sensing element such as a photogate or a photodiode. Each of the above components and a processor may be implemented as a single chip or separate chips.

Figure 15:
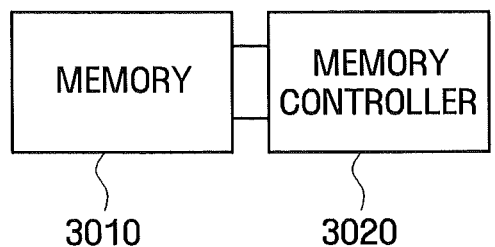
FIG. 15 is a block diagram of an exemplary memory system which uses nonvolatile memory devices according to exemplary embodiments of the inventive subject matter.

FIG. 15 is a block diagram of an exemplary memory system which uses nonvolatile memory devices according to exemplary embodiments of the inventive subject matter.

Referring to FIG. 15, a memory 3010 is coupled to a memory controller 3020. The memory 3010 may be any of the nonvolatile memory device embodiments described above. The memory controller 3020 supplies input signals for controlling operation of the memory 3010. For example, the memory controller 3020 supplies a command CMD and address signals. The memory controller 3020 may include a memory interface, a host interface, an error correction code (ECC) circuit, a CPU, and a buffer memory. The memory interface provides data transmitted from the buffer memory to the memory 3010 or transmits data read out of the memory 3010 to the buffer memory. Also, the memory interface may provide a command or an address transmitted from an external host to the memory 3010.

The host interface may communicate with an external host through USB, small computer system interface (SCSI), peripheral component interconnect (PCI) express, AT attachment (ATA), parallel ATA (PATA), serial ATA (SATA), or serial attached SCSI (SAS), for example.

A memory system according to embodiments of the inventive subject matter may include an ECC circuit, which generates a parity bit using data transmitted to the memory 3010. The generated parity bit may be stored in a specific area of the memory 3010, together with data. The ECC circuit detects an error of data read out of the memory 3010. If the detected error is within a correction range, the ECC circuit corrects the detected error.

The CPU controls the external host or the memory 3010 through the host interface or the memory interface. The CPU may control write, read, and erase operations depending on firmware for driving a memory.

The buffer memory temporarily stores write data provided from the external host or data read out of the memory 3010. Also, the buffer memory may store meta data or cache data to be stored in the memory 3010. During a sudden power-off operation, meta data or cache data stored in the buffer memory may be stored in the memory 3010. The buffer memory may be a dynamic random access memory (DRAM) and an SRAM.

Figure 16:
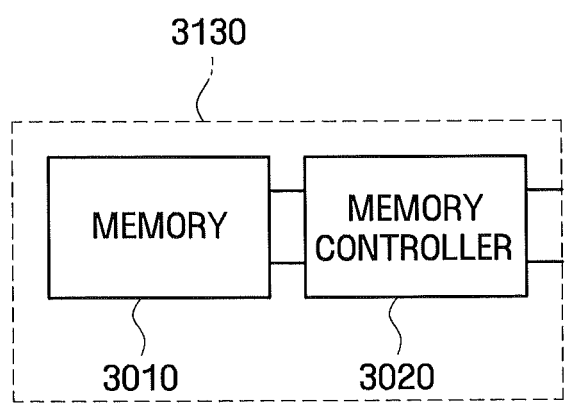
FIG. 16 is a block diagram of another exemplary memory system which uses nonvolatile memory devices according to exemplary embodiments of the inventive subject matter.

FIG. 16 is a block diagram of another exemplary memory system which uses nonvolatile memory devices according to exemplary embodiments of the inventive subject matter. This memory system is the same as the memory system of FIG. 15, except that a memory 3010 and a memory controller 3020 are embedded in a card 3130. For example, the card 3130 may be a flash memory card. Namely, the card 3130 may be a card meeting any industry standard for use with a consumer electronics device such as a digital camera, personal computer, etc. It will be appreciated that the memory controller 3020 may control the memory 3010 based on controls signals received by the card 3130 from another (e.g., external) device.

Figure 17:
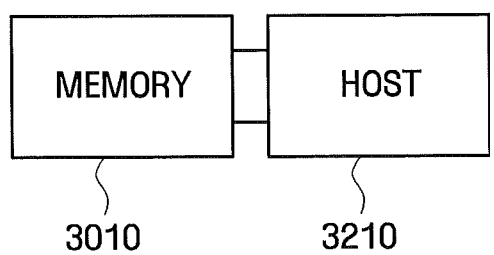
FIG. 17 is a block diagram of another exemplary memory system which uses nonvolatile memory devices according to exemplary embodiments of the inventive subject matter.

FIG. 17 is a block diagram of another exemplary memory system which uses nonvolatile memory devices according to exemplary embodiments of the inventive subject matter. Referring to FIG. 17, a memory 3010 is coupled to a host system 3210. The host system 32210 may be a processing system such as a PC or a digital camera. The host system 3210 may use the memory 3010 as an erasable storage device. As described above, the host system 3210 may provide input signals to control the memory 3010. For example, the host system 3210 may provide a command CMD and an address signal.

Figure 18:
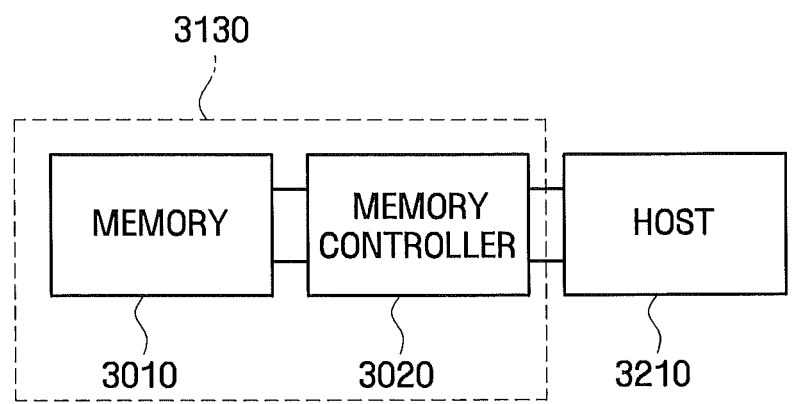
FIG. 18 is a block diagram of another exemplary memory system which uses nonvolatile memory devices according to exemplary embodiments of the inventive subject matter.

FIG. 18 is a block diagram of another exemplary memory system which uses nonvolatile memory devices according to exemplary embodiments of the inventive subject matter. Referring to FIG. 18, a host system 3210 is coupled to a card 3130. The host system 3210 transmits a control signal to the card 3130, and a memory controller 3020 controls the memory 3130.

Figure 19:
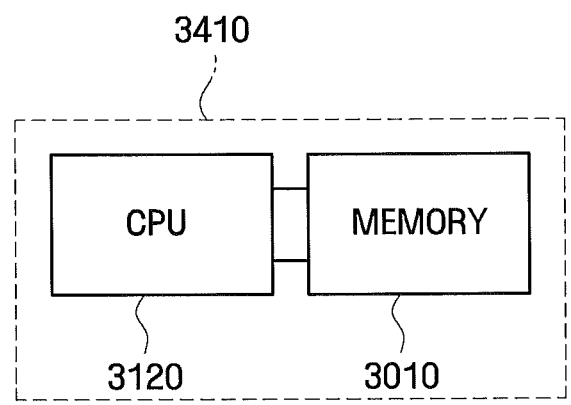
FIG. 19 is a block diagram of another exemplary memory system which uses nonvolatile memory devices according to exemplary embodiments of the inventive subject matter.

FIG. 19 is a block diagram of another exemplary memory system which uses nonvolatile memory devices according to exemplary embodiments of the inventive subject matter. Referring to FIG. 19, a memory 3010 is connected to a CPU 3120 within a computer system 3410. For example, the computer system 3410 may be a personal computer, PDA, etc. The memory 3010 may be directly connected with the CPU 3120 via a bus, etc.

A nonvolatile memory device according to exemplary embodiments of the inventive subject matter may be used as a storage class memory (SCM), which is the general concept of memories capable of simultaneously providing nonvolatile characteristics and access characteristics. The SCM may be utilized as not only a data storage space but also a program performing space.

The above-described phase-change random access memory (PRAM), resistive RAM (RRAM), ferroelectric RAM (FRAM), and magnetic RAM (MRAM) may be appropriate examples of an SCM. Such an SCM may be used as not only a data storage memory instead of a flash memory but also a main memory instead of an SRAM. Moreover, one SCM may be used instead of a flash memory and an SRAM.

Figure 20:
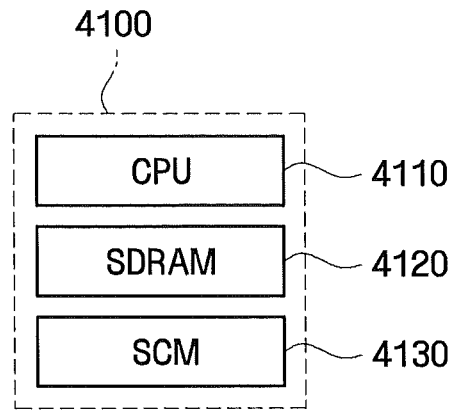
FIG. 20 is a block diagram of a memory system which uses a storage class memory (SCM)

FIG. 20 is a block diagram of a memory system 4100 which uses an SCM. Referring to FIG. 20, the memory system 4100 includes a CPU 4110, a synchronous DRAM (SDRAM) 4120, and an SCM 4130 used instead of a flash memory.

In the memory system 4100, data access speed of the SCM 4130 is higher than that of a flash memory. For example, under a PC environment where the CPU 4110 runs at 4 GHz, data access speed of a PRAM which is a kind of the SCM 4130 is about 32 times higher than that of a flash memory. Thus, the memory system 4100 equipped with the SCM 4130 may attain higher-speed access gain than a memory system equipped with a flash memory.

Figure 21:
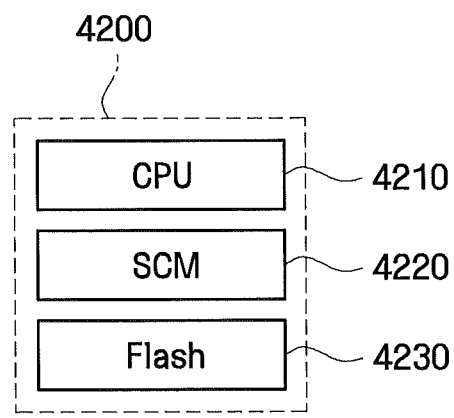
FIG. 21 is a block diagram of another exemplary memory system which uses an SCM.

FIG. 21 is a block diagram of another exemplary memory system 4200 which uses an SCM. Referring to FIG. 21, the memory system 4200 includes a CPU 4210, an SCM 4220 used instead of an SDRAM, and a flash memory 4230.

In the memory system 4200, power dissipation of the SCM 4220 is lower than that of an SDRAM. Energy dissipated by a main memory of a computer system amounts to about 40 percent of total energy. Therefore, many efforts have been intensively made to reduce power dissipation of a main memory. An SCM may reduce dynamic energy dissipation to an average of about 53 percent and reduce energy dissipation caused by power leakage to an average of about 73 percent. As a result, the memory system 4200 equipped with the SCM 4220 may allow power dissipation to be reduced more than a memory system equipped with an SDRAM.

Figure 22:
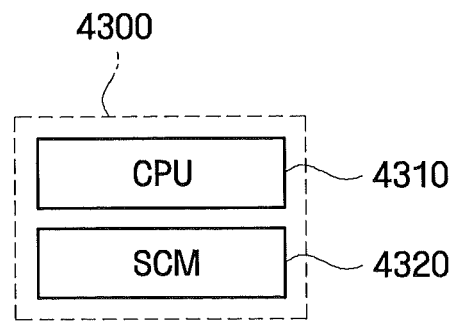
FIG. 22 is a block diagram of another exemplary memory system which uses an SCM.

FIG. 22 is a block diagram of another exemplary memory system 4300 which uses an SCM. Referring to FIG. 22, the memory system 4300 includes a CPU 4310 and an SCM 4320. The SCM 4320 is used as main memory instead of an SDRAM and as a data storage memory instead of a flash memory. This memory system 4300 is advantageous in data access speed, low power, space utilization, and costs.

In concluding the detailed description, those skilled in the art will appreciate that many variations and modifications can be made to the preferred embodiments without substantially departing from the principles of the inventive subject matter. Therefore, the disclosed preferred embodiments of the inventive subject matter are used in a generic and descriptive sense only and not for purposes of limitation.

What is claimed is:

1. A read circuit comprising:
   a comparison circuit configured to compare a voltage at a first signal node with a reference voltage and to responsively generate a control signal;
   a read current control circuit connected between a first voltage node and the first signal node and configured to provide a read current to a memory element responsive to the control signal;
   a mirror circuit connected between a second voltage node and a second signal node and configured to provide a mirror current in response to the control signal; and
   a sense circuit configured to sense a voltage at the second signal node and to responsively generate an output signal indicative of a state of the memory element.

2. The read circuit of claim 1, wherein the read current control circuit comprises a first p-channel metal oxide semiconductor (PMOS) transistor which is connected between the first voltage node and the first signal node and receives the control signal at a gate thereof and wherein the mirror circuit comprises a second PMOS transistor which is connected between the second voltage node and the second signal node and receives the control signal at a gate thereof.

3. The read circuit of claim 1, wherein the first voltage node is a power supply node and wherein the second voltage node is a power supply node.

4. The read circuit of claim 1, further comprising a reference current control circuit connected to the second signal node and configured to generate a reference current that flows from the second signal node to a ground node.

5. The read circuit of claim 4, wherein the reference voltage comprises a first reference voltage and wherein the reference current control circuit comprises an n-channel metal oxide semiconductor (NMOS) transistor connected between the second signal node and the ground node and configured to receive a second reference voltage at a gate thereof.

6. The read circuit of claim 5, wherein the second reference voltage is a constant voltage.

7. The read circuit of claim 1, further comprising:
   a first discharge circuit connected to the first signal node and configured to discharge the first signal node; and
   a second discharge circuit connected to an output node of the comparison circuit and configured to discharge an output of the comparison circuit.

8. The read circuit of claim 1, wherein a ratio of the read current to the mirror current is 1:n, wherein n is a positive number.

9. The read circuit of claim 1, further comprising a first auxiliary current control circuit connected to the second signal node and configured to provide a first auxiliary current to the second signal node.

10. The read circuit of claim 1, further comprising a second auxiliary current control circuit connected to the second signal node and configured to provide a second auxiliary current that flows from the second signal node to the ground node.

11. The read circuit of claim 1, wherein the sense circuit comprises an inverter.

12. A nonvolatile memory device comprising the read circuit of claim 1 coupled to a variable resistance memory element at the first signal node.

13. A nonvolatile memory device comprising:
    a variable resistive element connected to a first signal node;
    a comparison circuit configured to compare a voltage at the first signal node with a reference voltage and to responsively produce a control signal;
    a first PMOS transistor connected between a power supply node and the first signal node and configured to provide a read current in response to the control signal;
    a second PMOS transistor connected between the power supply node and a second signal node and configured to provide a mirror current responsive to the control signal; and
    a sense circuit configured to sense a voltage at the second signal node and to responsively generate an output signal indicative of a state of the variable resistance memory element.

14. The nonvolatile memory device of claim 13, further comprising an NMOS transistor configured to generate a reference current that flows from the second signal node to a ground node.

15. The nonvolatile memory device of claim 13, wherein a ratio of the read current to the mirror current is 1:n, wherein n is a positive number.

16. The nonvolatile memory device of claim 13, further comprising a third PMOS transistor connected to the second signal node and configured to provide a first auxiliary current to the second signal node.

17. The nonvolatile memory device of claim 13, further comprising an NMOS transistor connected to the second signal node and configured to provide a second auxiliary current that flows from the second signal node to the ground node.

18. A nonvolatile memory device comprising:
    a variable resistance memory element connected to a first signal node; and
    a read circuit coupled to the variable resistance memory element at a first signal node and configured to provide a read current to the variable resistance memory element via the first signal node, to a provide a mirror current at a second signal node responsive to the cell current and to generate an output signal indicative of a state of the variable resistance memory element responsive to a voltage at the second signal node.

19. The memory device of claim 18, wherein the read circuit comprises:
    a comparison circuit configured to compare a voltage at the first signal node with a reference voltage and to responsively generate a control signal;
    a read current control circuit connected between a first voltage node and the first signal node and configured to provide the read current to the variable resistance memory element responsive to the control signal;
    a mirror circuit connected between a second voltage node and the second signal node and configured to provide the mirror current in response to the control signal; and
    a sense circuit configured to sense the voltage at the second signal node and to responsively generate the output signal indicative of a state of the memory element.

20. The memory device of claim 18, further comprising a reference current control circuit connected to the second signal node and configured to generate a reference current that flows from the second signal node to a ground node.

* * * * *